United States Patent
Ishibashi

(10) Patent No.: US 9,148,590 B2
(45) Date of Patent: Sep. 29, 2015

(54) IMAGING APPARATUS WITH REFERENCE SIGNALS HAVING DIFFERENT RATE OF CHANGE FIRST AND SECOND PIXELS HAVING SAME COLOR

(75) Inventor: Koji Ishibashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 435 days.

(21) Appl. No.: 13/540,168

(22) Filed: Jul. 2, 2012

(65) Prior Publication Data

US 2013/0021493 A1 Jan. 24, 2013

(30) Foreign Application Priority Data

Jul. 19, 2011 (JP) .................................. 2011-158232

(51) Int. Cl.

| H04N 5/228 | (2006.01) |
|---|---|
| *H04N 5/335* | (2011.01) |
| *H04N 5/378* | (2011.01) |
| *H03M 1/00* | (2006.01) |
| H03M 1/56 | (2006.01) |
| H03M 1/12 | (2006.01) |

(52) U.S. Cl.
CPC .............. *H04N 5/335* (2013.01); *H03M 1/008* (2013.01); *H04N 5/378* (2013.01); *H03M 1/123* (2013.01); *H03M 1/56* (2013.01)

(58) Field of Classification Search
CPC ......... H04N 5/378; H03M 1/56; H03M 1/123
USPC ...................................................... 348/222.1
See application file for complete search history.

(56) References Cited

U.S. PATENT DOCUMENTS

| 8,350,941 B2 * | 1/2013 | Kukita ........................... 348/308 |
| 8,792,030 B2 * | 7/2014 | Tanaka ........................... 348/281 |
| 2009/0073274 A1 | 3/2009 | Dai | |

(Continued)

FOREIGN PATENT DOCUMENTS

| CN | 101523899 A | 9/2009 |
| CN | 101534376 A | 9/2009 |
| CN | 101888492 A | 11/2010 |
| EP | 2 037 668 A2 | 3/2009 |

(Continued)

OTHER PUBLICATIONS

Extended European Search Report, dated Feb. 6, 2014, issued in counterpart European Patent Application No. 12176647.1 (7 pages).

*Primary Examiner* — Gary C Vieaux
(74) *Attorney, Agent, or Firm* — Fitzpatrick, Cella, Harper & Scinto

(57) ABSTRACT

An imaging apparatus includes a first pixel generating a signal by photoelectric conversion, a second pixel arranged in the same row as the first pixel and generating a signal by photoelectric conversion, a first comparator comparing the signal based on the first pixel with a first reference signal having a level changed according to passage of time, and a second comparator comparing the signal based on the second pixel with a second reference signal having a rate of change for passage of time different from that of the first reference signal. In addition, a first counter counts until the first comparator outputs a signal indicating inversion of magnitude relation of the signal based on the first pixel and the first reference signal, and a second counter counts until the second comparator outputs a signal indicating inversion of magnitude relation of the signal based on the second pixel and the second reference signal.

8 Claims, 9 Drawing Sheets

(56) References Cited

U.S. PATENT DOCUMENTS

2009/0225211 A1 9/2009 Oike
2010/0283878 A1 11/2010 Lin
2011/0037868 A1* 2/2011 Ota .......................... 348/222.1
2012/0086842 A1 4/2012 Oike

FOREIGN PATENT DOCUMENTS

| EP | 2 071 831 A1 | | 6/2009 |
|----|--------------|---|--------|
| JP | 2006-109117 A | | 4/2006 |
| JP | 2006109117 A | * | 4/2006 |
| JP | 2008-098722 A | | 4/2008 |

* cited by examiner

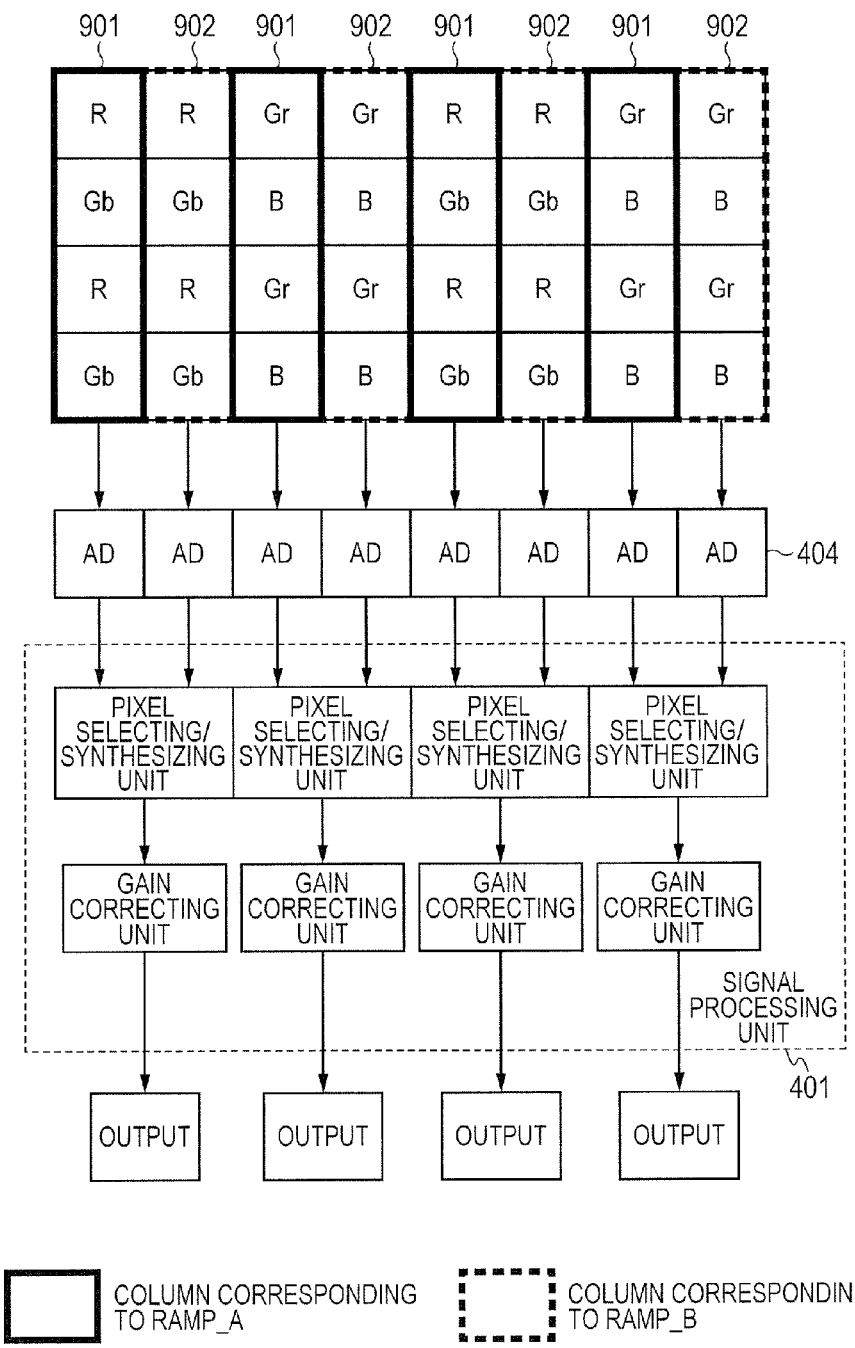

IMAGING APPARATUS WITH REFERENCE SIGNALS HAVING DIFFERENT RATE OF CHANGE FIRST AND SECOND PIXELS HAVING SAME COLOR

BACKGROUND OF THE INVENTION

1. Field of the Invention

The present invention relates to an imaging apparatus.

2. Description of the Related Art

With respect to a pixel reading circuit of an image sensor, there has been proposed an image sensor which is equipped with a so-called column-parallel AD (analog-to-digital) converter having an AD converter for each pixel column. In the column-parallel AD converter of this type, a pixel signal and a ramped reference signal are compared with each other by a comparator, and a time from a start of conversion to inversion of an output from the comparator is counted by a counter, whereby AD conversion is performed. Furthermore, in the column-parallel AD converter of this type, the low-speed AD converter is provided for each pixel column, and thus the AD conversion is performed in parallel by the provided low-speed AD converters. For this reason, since the bands of the comparators and an amplifier which constitute the column-parallel AD converter can be lowered, an AD conversion system which uses the column-parallel AD converter has an advantage over other AD conversion systems in terms of an S/N (signal-to-noise) ratio.

Incidentally, a voltage of the reference signal is changed in synchronization with an operation of the counter which counts the conversion time. Consequently, for example, when an eight-bit AD converter is used, a processing time corresponding to $2^8$ steps, i.e., 256 steps, is necessary. Further, when the gradient of the ramped reference signal is increased, the voltage value of the AD converter for each step is increased. That is, there is a method of extending the dynamic range of the AD converter by lowering (roughening) the resolution thereof.

Moreover, as a method of extending the dynamic range without deteriorating a resolution characteristic, there has been known the method which is described in Japanese Patent Application Laid-Open No. 2008-098722. That is, in Japanese Patent Application Laid-Open No. 2008-098722, the reference voltages of which the gradients of the slopes are respectively different are used, the output voltage of the unit pixel and the reference voltage are compared with each other, and further the reference voltage and the second reference voltage are compared with each other. Thus, since the counting operation is performed by using the two comparators, the high-speed AD conversion can be achieved, whereby the dynamic range can be extended. However, in this method, since the two comparators which mainly occupy the AD conversion constitution are necessary for each column, there is a problem that the circuit area resultingly increases.

In the column-parallel AD converter equipped image sensor (that is, the image sensor which is equipped with the column-parallel AD converter), the number of counts of the conversion time is given as the result of the AD conversion. For this reason, it is difficult to extend the dynamic range due to restrictions of the conversion time.

In the general column-parallel AD converter, it is possible to extend the dynamic range by increasing the gradient of the slope of the reference voltage. However, in such a case, the voltage for one LSB becomes large, whereby there is a problem that a trade-off occurs between the voltage and the resolution. For this reason, when the low-illuminance pixels and the high-illuminance pixels mixedly exist in the same row, there is a problem that it is difficult to select an appropriate gradient of the slope of the reference signal. Here, as a method of extending the dynamic range of the AD converter while maintaining the resolution, there are several methods, which include a method of adjusting the gain of the column amplifier for each conversion, a method of performing an addition process in the frame direction, and a method of using the plurality of comparators. However, in any of these methods, there are several problems. That is, the overall circuit constitution becomes complex, the number of frames decreases, and the chip itself becomes large in size. Due to such reasons as described above, in an imaging apparatus which uses the column-parallel AD converter, it is necessary to properly change the dynamic range by using the reference signals having the different gradients in the row without complicating the circuit constitution.

SUMMARY OF THE INVENTION

The present invention aims to provide an imaging apparatus which is characterized by comprising: a first pixel configured to generate a signal by photoelectric conversion; a second pixel, arranged in a row same as that in which the first pixel is arranged, configured to generate a signal by photoelectric conversion; a first comparator configured to compare the signal based on the first pixel with a first reference signal of which a level is changed according to passage of time; a second comparator configured to compare the signal based on the second pixel with a second reference signal of which a rate of change for passage of time is different from that of the first reference signal; a first counter configured to perform counting until the first comparator outputs a signal indicating that a magnitude relation of the signal based on the first pixel and the first reference signal is inverted; a second counter configured to perform counting until the second comparator outputs a signal indicating that a magnitude relation of the signal based on the second pixel and the second reference signal is inverted; and a processing unit configured to generate one pixel signal at least based on a count value of the first counter and/or a count value of the second counter.

Further features of the present invention will become apparent from the following description of the exemplary embodiments with reference to the attached drawings.

BRIEF DESCRIPTION OF THE DRAWINGS

FIG. 9 is a block diagram for describing allocation of reference signals and signal processing to be performed among pixels.

DESCRIPTION OF THE EMBODIMENTS

Preferred embodiments of the present invention will now be described in detail in accordance with the accompanying drawings.

(First Embodiment)

Figure 1:
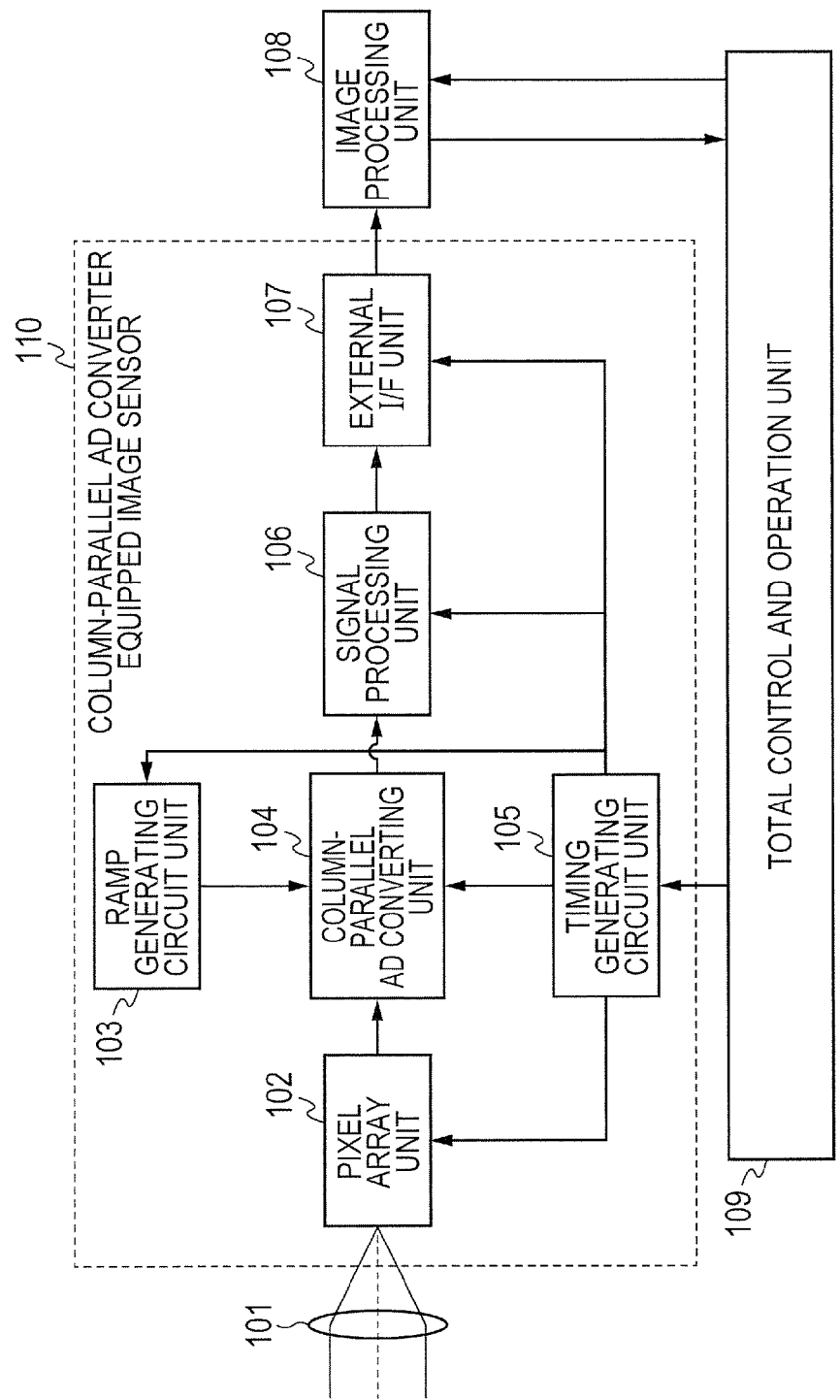
FIG. 1 is a block diagram illustrating a constitution example of an imaging apparatus according to the first embodiment of the present invention.

FIG. 1 is a block diagram illustrating a constitution example of an imaging apparatus according to the first embodiment of the present invention. Here, the imaging apparatus is, for example, a camera system, and includes an optical system which introduces (forms a subject image) incident light into a pixel region of a column-parallel AD converter equipped image sensor 110. For example, a lens 101 for forming the incident light (i.e., image light) on an imaging surface is used as the optical system. More specifically, the imaging apparatus has the column-parallel AD converter equipped image sensor 110, an image processing unit 108 which performs a signal processing to a pixel signal transferred from the column-parallel AD converter equipped image sensor 110, and an entire control and operation unit 109 which controls driving of the image processing unit 108. Further, the entire control and operation unit 109 has a timing generator which generates various kinds of timing signals including a start pulse and a clock pulse for driving the circuits provided in the column-parallel AD converter equipped image sensor 110, and thus drives the column-parallel AD converter equipped image sensor 110 at predetermined timing. Furthermore, the image processing unit 108 performs image processes such as a conversion process for converting a pixel output signal in an RGB color space into signals in a YCbCr color space, a gamma correction process, and the like. Then, the image signal which was processed by the image processing unit 108 is recorded on a recording medium such as a memory or the like, and image information recorded and stored on the recording medium is then copied as a hard copy by a printer or the like. Besides, the image signal which was processed by the image processing unit 108 is displayed as a moving image on a monitor which includes a liquid crystal display and the like. The column-parallel AD converter equipped image sensor 110 has a pixel array unit 102 which converts the light imaged by the lens 101 into an electrical signal, and a ramp generating circuit unit 103 which generates a reference signal to be used in AD conversion. Here, it should be noted that the reference signal is changed according to passage of time. Further, the column-parallel AD converter equipped image sensor 110 has a column-parallel AD converting unit 104 which converts an analog signal transferred from the pixel array unit 102 into a digital signal, and a timing generating circuit unit 105 which generates a control pulse to be used in the AD conversion. Furthermore, the column-parallel AD converter equipped image sensor 110 has a signal processing unit 106 which performs a process such as CDS (correlated double sampling) or the like to the AD-converted output result, and an external I/F (interface) unit 107 which performs a process such as LVDS (low voltage differential signaling) or the like. In any case, although the imaging apparatus has other various kinds of functional parts, only the parts which are characteristic in the present embodiment are described as above.

Figure 2:
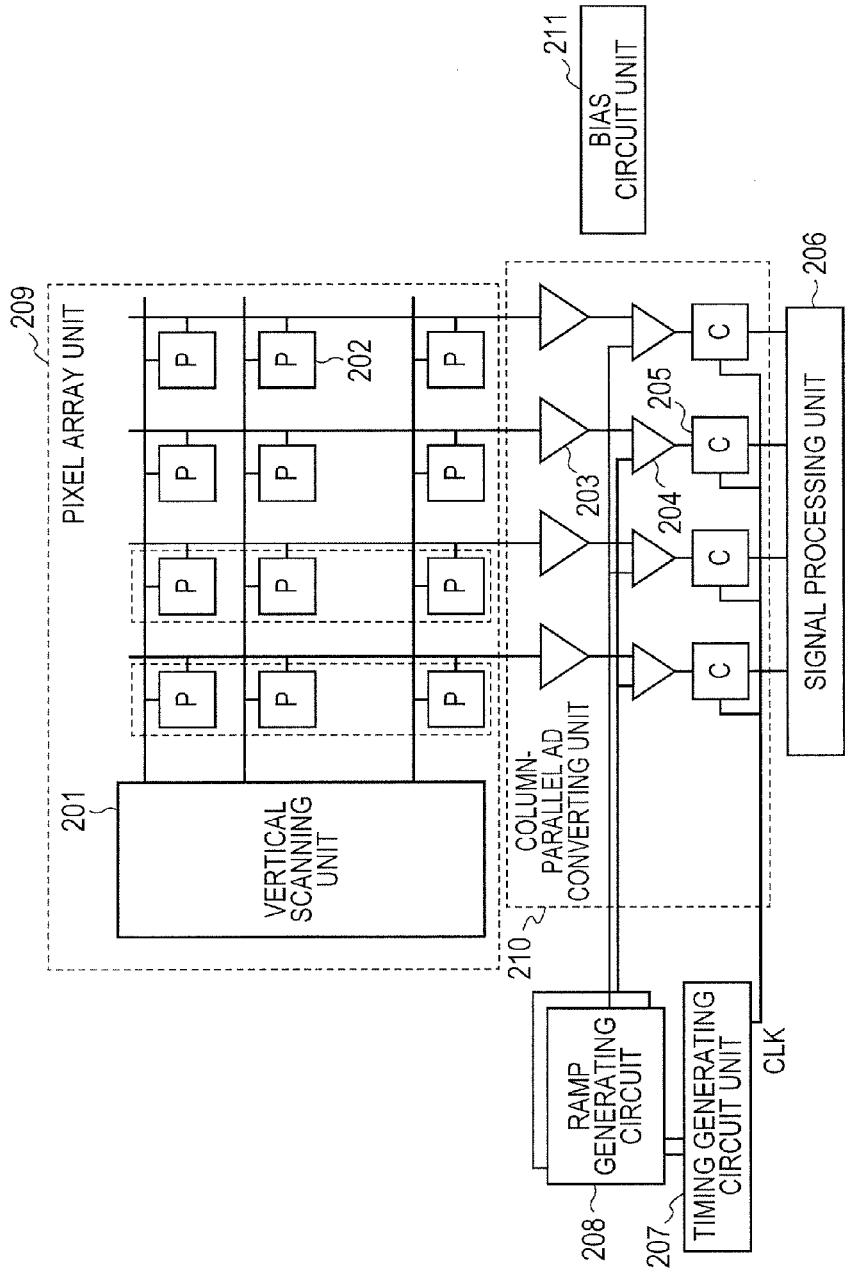
FIG. 2 is a block diagram illustrating a column-parallel AD converter equipped image sensor.

FIG. 2 is a block diagram illustrating a constitution example of the column-parallel AD converter equipped image sensor (CMOS (complementary metal-oxide semiconductor) image sensor) in FIG. 1. Here, a pixel array unit 209 in FIG. 2 corresponds to the pixel array unit 102 in FIG. 1, a column-parallel AD converting unit 210 in FIG. 2 corresponds to the column-parallel AD converting unit 104 in FIG. 1, a ramp generating circuit (reference signal generating circuit) 208 in FIG. 2 corresponds to the ramp generating circuit unit 103 in FIG. 1, a timing generating circuit unit 207 in FIG. 2 corresponds to the timing generating circuit unit 105 in FIG. 1, and a signal processing unit 206 in FIG. 2 corresponds to the signal processing unit 106 in FIG. 1. Here, the column-parallel AD converter equipped image sensor 110 has the pixel array unit 209 which serves as an imaging unit, the signal processing unit 206, and the timing generating circuit unit 207 which performs timing control for various kinds of driving pulses. The pixel array unit 209 includes pixels (P) 202 which are arranged in a two-dimensional matrix, and a vertical scanning unit 201. Further, the column-parallel AD converter equipped image sensor 110 has the column-parallel AD converting unit 210 which serves as a reading unit for the pixel array unit 209, and a bias circuit unit 211 which controls the currents flowing in column amplifiers 203, comparators 204 and the like. Furthermore, the column-parallel AD converter equipped image sensor 110 has the ramp generating circuit 208 which generates the reference signal. Here, the column-parallel AD converting unit 210 includes the column amplifiers 203, the comparators 204, and counters (C) 205. The counter 205 counts the number of clocks of a clock signal CLK generated by the timing generating circuit unit 207. It should be noted that, in the above constituent parts, the pixel array unit 209, the vertical scanning unit 201, the column-parallel AD converting unit 210, the ramp generating circuit 208 and the bias circuit unit 211 are constituted by analog circuits respectively. On the other hand, the timing generating circuit unit 207 and the signal processing unit 206 are constituted by digital circuits respectively. Further, each of the pixels 202, which includes a photodiode and an in-pixel amplifier, generates a signal by photoelectric conversion. For example, the pixels each of which is illustrated in FIG. 7 are arranged in the matrix (rows and columns).

Figure 7:
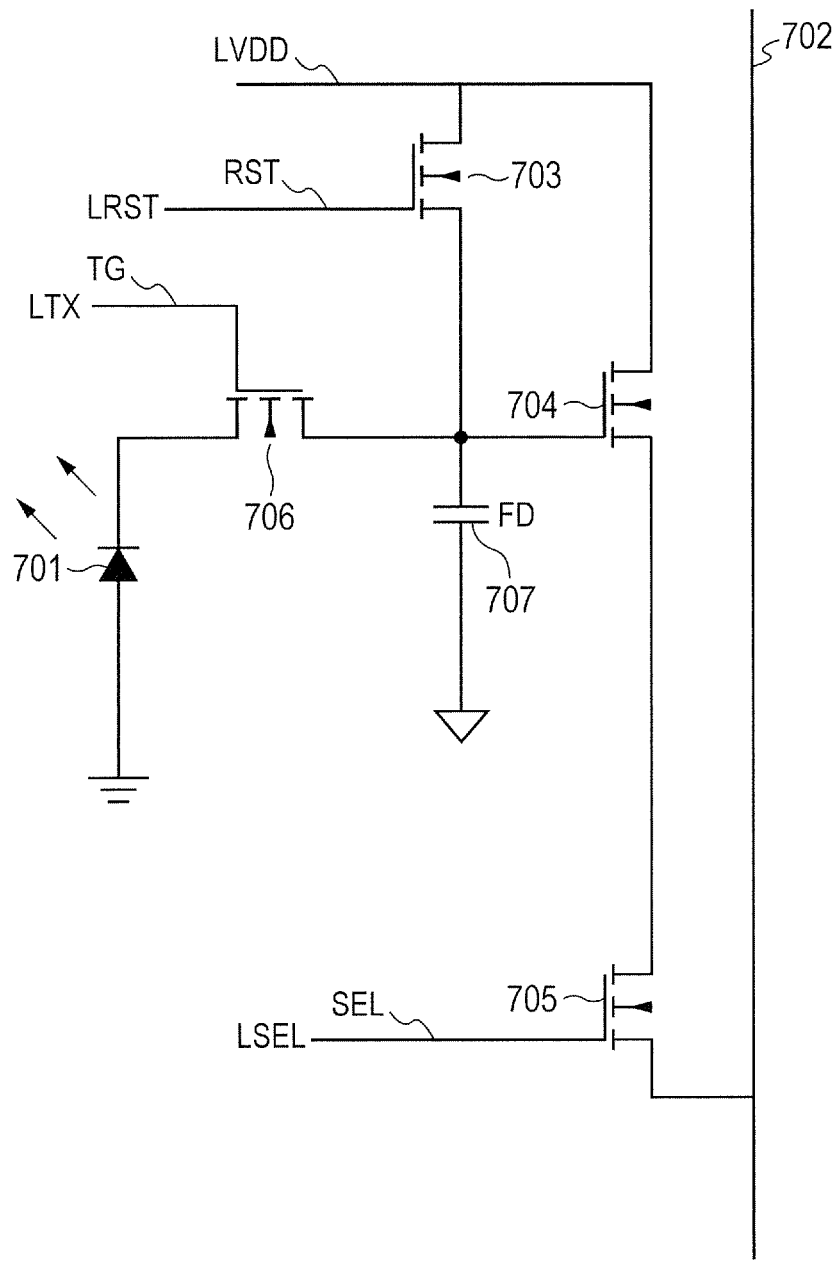
FIG. 7 is a diagram for describing a pixel unit of the column-parallel AD converter equipped image sensor.

FIG. 7 is the diagram for describing an example of the constitution of each of the pixels 202 included in the column-parallel AD converter equipped image sensor 110. More specifically, the pixel 202 has a photoelectric conversion element (e.g., a photodiode) 701, a transfer transistor 706 which serves as a transfer switch, a reset transistor 703 which resets a pixel level, an amplifying transistor 704, and a selection transistor 705. Here, the photodiode 701 photoelectrically converts incident light into electrical charges (i.e., electrons in this case) of which the amount corresponds to the amount of the incident light. The transfer transistor 706 is connected between the photodiode 701 and a floating diffusion (FD) 707 which serves as an output node of the photodiode 701. When a driving signal TG is given to the gate (transfer gate) of the transfer transistor 706 through a transfer control line LTX, the electrical charge photoelectrically converted by the photodiode 701 is transferred to the floating diffusion 707 by the transfer transistor 706. The reset transistor 703 is connected between a power supply line LVDD and the floating diffusion 707. When a reset signal RST is given to the gate of the reset transistor 703 through a reset control line LRST, the potential of the floating diffusion 707 is reset to the potential of the power supply line LVDD by the reset transistor 703. The floating diffusion 707 is connected to a vertical signal line 702 through the amplifying transistor 704. The amplifying transistor 704 constitutes a source follower, together with an external constant current source of the pixel 202.

Then, a control signal (an address signal or a select signal) SEL is given to the gate of the selection transistor 705 through a selection control line LSEL, and the selection transistor 705 is turned on. When the selection transistor 705 is turned on, the potential of the floating diffusion 707 is amplified by the amplifying transistor 704, and the voltage corresponding to the amplified potential is output to the vertical signal line 702. Then, the voltage output from each pixel 202 through the vertical signal line 702 is further output to the column-parallel AD converting unit 210 which serves as the pixel signal reading circuit. Here, it should be noted that the above-described operations are simultaneously performed for the pixels 202 corresponding to one row because, for example, the gates of the transfer transistor 706, the reset transistor 703 and the selection transistor 705 are connected by one row.

The reset control line LRST, the transfer control line LTX and the selection control line LSEL in the pixel array unit 209 are arranged as one set of wirings for each row of the pixels 202. Here, the reset control line LRST, the transfer control line LTX and the selection control line LSEL are driven by the vertical scanning unit 201 which serves as a pixel driving unit. Timing signals necessary for the signal processes in the pixel array unit 209, the vertical scanning unit 201, the signal processing unit 206, the column-parallel AD converting unit 210 and the ramp generating circuit 208 are generated by the timing generating circuit unit 207. In the pixel array unit 209, a video and a screen image are photoelectrically converted for each pixel row by accumulating and discharging photons with use of a line shutter, and then the obtained analog signals are output to the column-parallel AD converting unit 210. Subsequently, in the column-parallel AD converting unit 210, the analog output signal of the pixel array unit 209 and the reference signal from the ramp generating circuit 208 are compared with each other for each column, and then the digital signal obtained based on the compared result is output.

The plurality of AD converters are arranged in the column-parallel AD converting unit 210. Here, each AD converter has the comparator 204 which compares the reference signal changed like a step or a slope with the analog signal obtained from the pixel 202 through the vertical signal line 702 and amplified by the column amplifier 203. Further, the AD converter of each column has the counter 205 which counts the comparison time, latches the counted result and holds the latched result. When the voltage of the pixel signal from the column amplifier 203 and the voltage of the reference signal come to be the same, the output of the comparator 204 arranged for each column is inverted, the counting of the counter 205 is stopped, and the AD conversion is completed. In the present embodiment, although the column amplifier 203 is used for each pixel column, the signal from the vertical signal line 702 of the pixel may be directly input to the comparator 204. Here, the plurality of reference signals are generated by the ramp generating circuit 208. Hereinafter, the concrete constitution and function of the ramp generating circuit 208 will be described in detail.

The ramp generating circuit 208 generates the reference signal of which the level is changed according to passage of time. More specifically, the reference signal is a signal which has a sloped (having a gradient) waveform of which the level is changed like a step or a ramp according as time passes. For example, in the ramp generating circuit 208, digital-to-analog conversion is performed by a digital-to-analog converting circuit in response to a control signal given from the timing generating circuit unit 207, and thus the reference signal is generated. The imaging apparatus has the plurality of ramp generating circuits 208, and the plurality of ramp generating circuits 208 generate, based on the clock signals transferred from the timing generating circuit unit 207, the reference signals of the plurality of systems respectively having slopes of different gradients, for example, two reference signals RAMP_A and RAMP_B. Incidentally, the means for generating the reference signal having the sloped waveform is not limited to the digital-to-analog converting circuit. Further, the method of generating the reference signals of the plurality of systems is not limited to the method of using the plurality of ramp generating circuits 208. The signal processing unit 106 or the image processing unit 108 performs gain correction when the gain of the column amplifier 203 is made different for each column, and a pixel selection process. The gain correction is performed by the signal processing unit 106 inside the column-parallel AD converter equipped image sensor 110, while the gain correction is performed by the image processing unit 108 outside the column-parallel AD converter equipped image sensor 110. In any case, the pixel selection process will be later described in detail. The imaging apparatus has a mode switching unit which selects either one of a mode of making the gradients of the reference signals different for the columns and a mode of using the same gradient of the reference signals for the columns.

Figure 4:
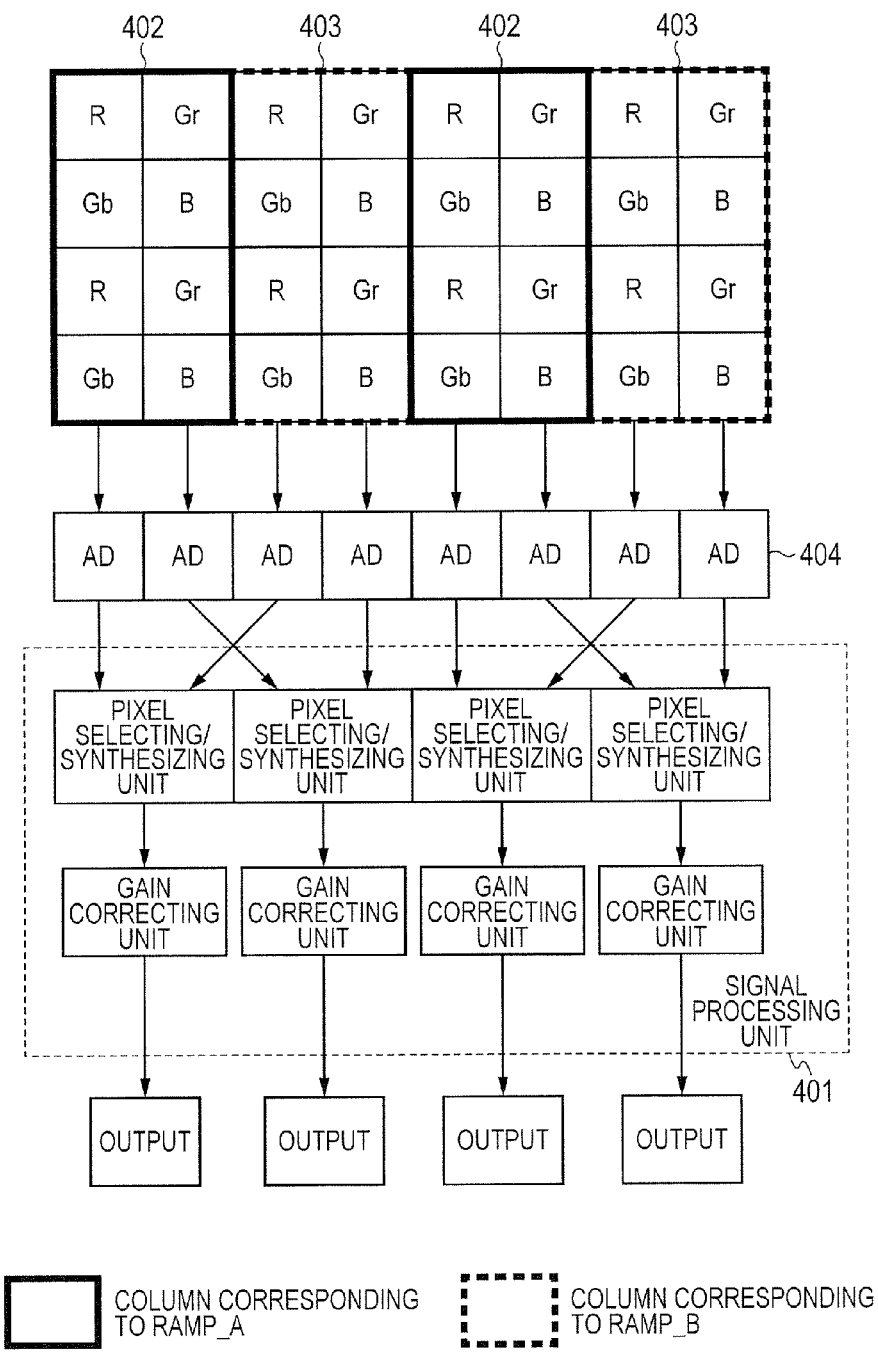
FIG. 4 is a block diagram for describing allocation of reference signals and signal processing to be performed among pixels.

Subsequently, a correspondence relation of the reference signals which is based on a case where a color filter is used for each pixel 202 will be described. FIG. 4 indicates a constitution example in which the two kinds of reference signals RAMP_A and RAMP_B respectively having different gradients are used. Here, the plurality of pixels 202 in FIG. 2 are divided into pixel column groups 402 and 403, and the color filter is provided on each pixel 202. The pixel column group 402 is the pixel region of the column corresponding to the reference signal RAMP_A, and the pixel column group 403 is the pixel region of the column corresponding to the reference signal RAMP_B. Here, a column-parallel AD converting unit 404 corresponds to the column-parallel AD converting unit 210 in FIG. 2, and a signal processing unit 401 corresponds to the signal processing unit 206 in FIG. 2. The signal processing unit 401 has pixel selecting/synthesizing units and gain correcting units. The pixel column groups 402 and 403 respectively corresponding to the reference signals RAMP_A and RAMP_B respectively having the different gradients are divided between the pixel columns which are most adjacent and to which the same-color color filters are provided. FIG. 4 illustrates the correspondence example of the reference signals RAMP_A and RAMP_B in a case where the R, Gr, Gb and B color filters are used respectively for the adjacent four pixels. Since the reference signals RAMP_A and RAMP_B are divided between the same-color adjacent pixel columns, each of the two reference signals RAMP_A and RAMP_B is alternately used for every two pixel columns. That is, each of the reference signals RAMP_A and RAMP_B respectively having the different gradients is used for each of the pixel column groups 402 and 403. Further, the signal processing unit 401 performs the pixel selecting/synthesizing process and the gain correcting process between the signals of the same-color pixels compared by the comparator 204 with use of the reference signals RAMP_A and RAMP_B respectively having the different gradients. The signal processing unit 401 corresponds to the signal processing unit 106 or the image processing unit 108 in FIG. 1. Here, it should be noted that the present embodiment is not limited to the column-parallel AD converter equipped image sensor 110 which uses the color filters in which the adjacent four pixels are arranged with R, Gr, Gb and B.

Likewise, in a case where three or more kinds of reference signals are used, the gradients of the reference signals are made different in the signals of the same-color pixels most adjacent in one row, and the AD conversion is performed. More specifically, when the three kinds of reference signals are used for the column-parallel AD converter equipped image sensor 110 having the color filters of R, Gr, Gb and B for the four pixels indicated in FIG. 4, the reference signals having the same gradient for every six pixel columns are used in the AD conversion. Incidentally, a three-CCD color sensor, a monochrome sensor or the like is constituted by a pixel arrangement using single-color color filters. For this reason, when the two kinds of reference signals are used for the relevant sensor, each of the reference signals RAMP_A and RAMP_B is alternately used for each pixel column in the AD conversion.

Figure 5:
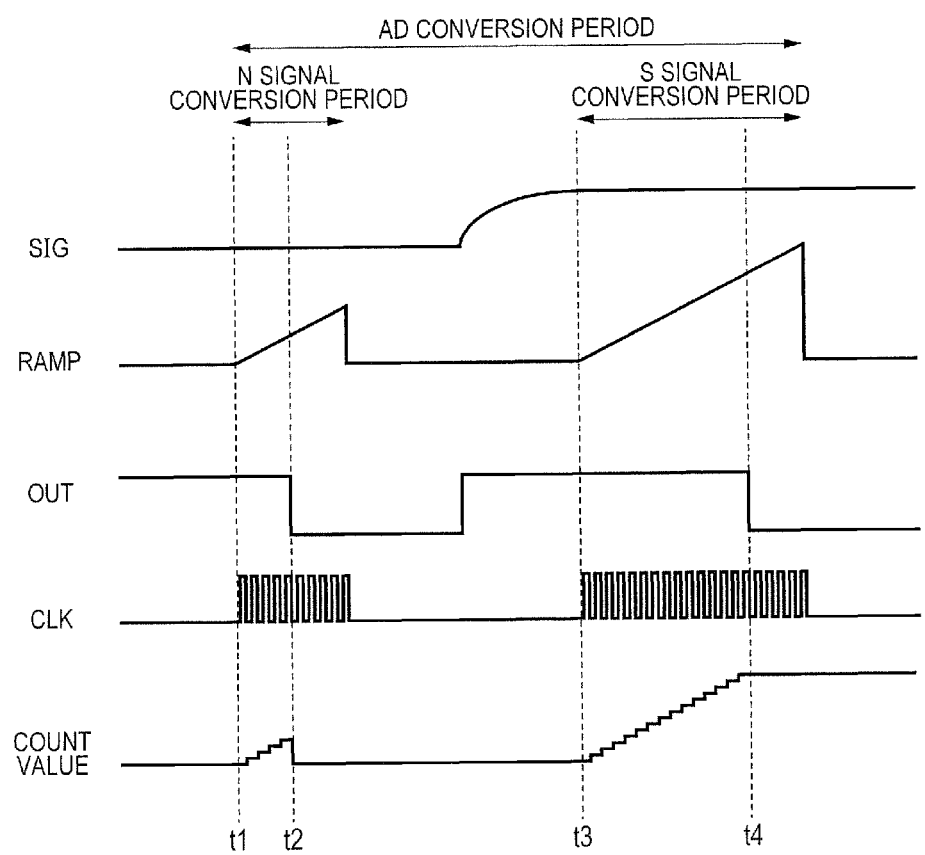
FIG. 5 is a timing chart for describing an AD conversion operation.

FIG. 5 is a timing chart for describing an operation to be performed in a second mode in which the AD conversion is performed using a same reference signal RAMP for all the columns. Here, the reference signal RAMP is generated by the ramp generating circuit 208. A signal (pixel signal) SIG based on the pixel 202 is the output signal of the column amplifier 203. Further, an AD conversion period includes an N signal conversion period in which the reset level of the pixel 202 is converted and an S signal conversion period in which the level of an optical signal is converted. In the N signal conversion period, as illustrated in FIG. 7, the pixel signal SIG is the output signal of the column amplifier 203 obtained when the reset transistor 703 is turned on, and the AD conversion is performed to the pixel reset signal. On the other hand, in the S signal conversion period, as illustrated in FIG. 7, the pixel signal SIG is the output signal of the column amplifier 203 obtained when the reset transistor 703 is turned off, and the AD conversion is performed to the optical signal stored in the photodiode 701. In the N signal conversion period, the reset transistor 703 is turned on. When the magnitude relation of the pixel signal SIG and the reference signal RAMP is inverted, an output signal OUT is inverted by the comparator 204. The number of clocks of a clock signal CLK is counted as a count value (digital signal) by the counter 205 during a period from a gradient start time t1 of the reference signal RAMP to a time t2 at which the output signal OUT of the comparator 204 is inverted. Thus, the pixel signal SIG is converted from an analog signal into a digital signal.

In the S signal conversion period, the reset transistor 703 is turned off. When the magnitude relation of the pixel signal SIG and the reference signal RAMP is inverted, the output signal OUT is inverted by the comparator 204. The number of clocks of the clock signal CLK is counted as the count value (digital signal) by the counter 205 during a period from a gradient start time t3 of the reference signal RAMP to a time t4 at which the output signal OUT of the comparator 204 is inverted. Thus, the pixel signal SIG is converted from an analog signal into a digital signal. After then, a difference between the count value subjected to the AD conversion in the S signal conversion period of the times t3 to t4 and the count value subjected to the AD conversion in the N signal conversion period of the times t1 to t2 is operated by the signal processing unit 106 or the image processing unit 108, whereby the pixel signal in which the reset level has been subtracted is obtained.

Figure 6:
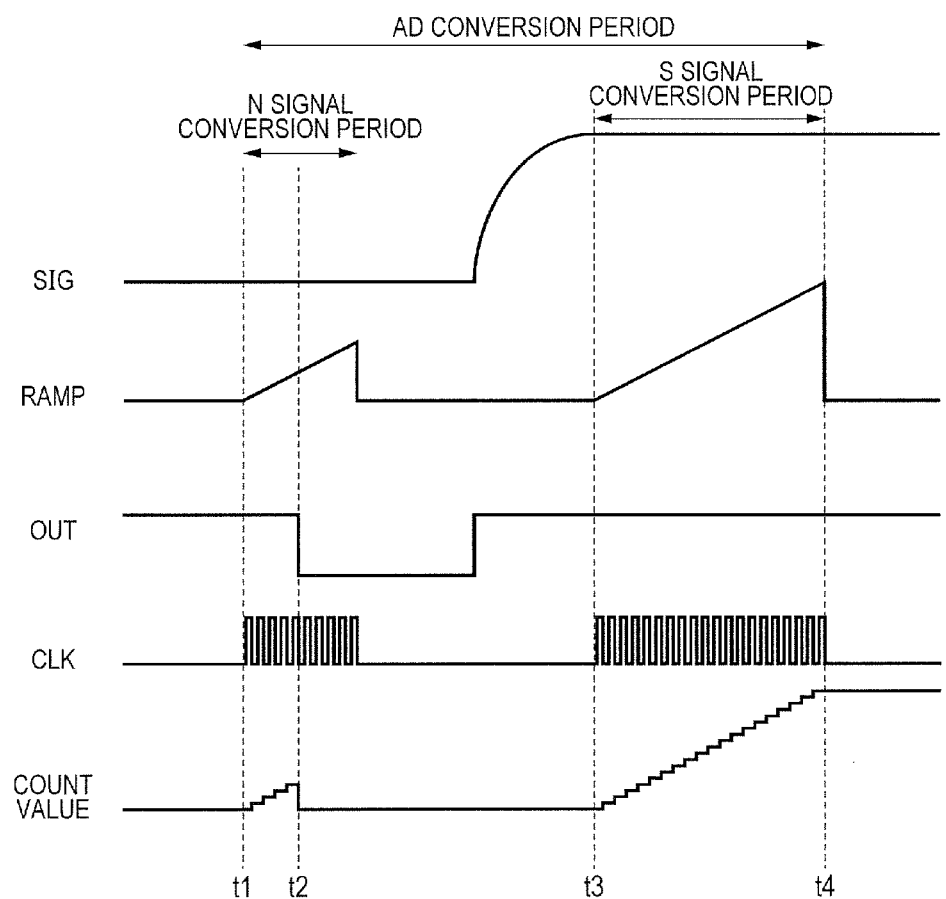
FIG. 6 is a timing chart for describing an AD conversion operation.

In the imaging apparatus, the illuminance of the image is detected from the result of the AD conversion, and the gradient of the reference signal RAMP is changed so that the inversion of the comparator 204 ends in the S signal conversion period. However, in the operation to be performed when the reference signal RAMP is commonly used for the respective columns, if the high-luminance pixel and the low-luminance pixel mixedly exist in the same row, as illustrated in FIG. 6, the output signal OUT of the comparator 204 is not inverted in the S signal conversion period, whereby the count value of the counter 205 is saturated.

Figure 3:
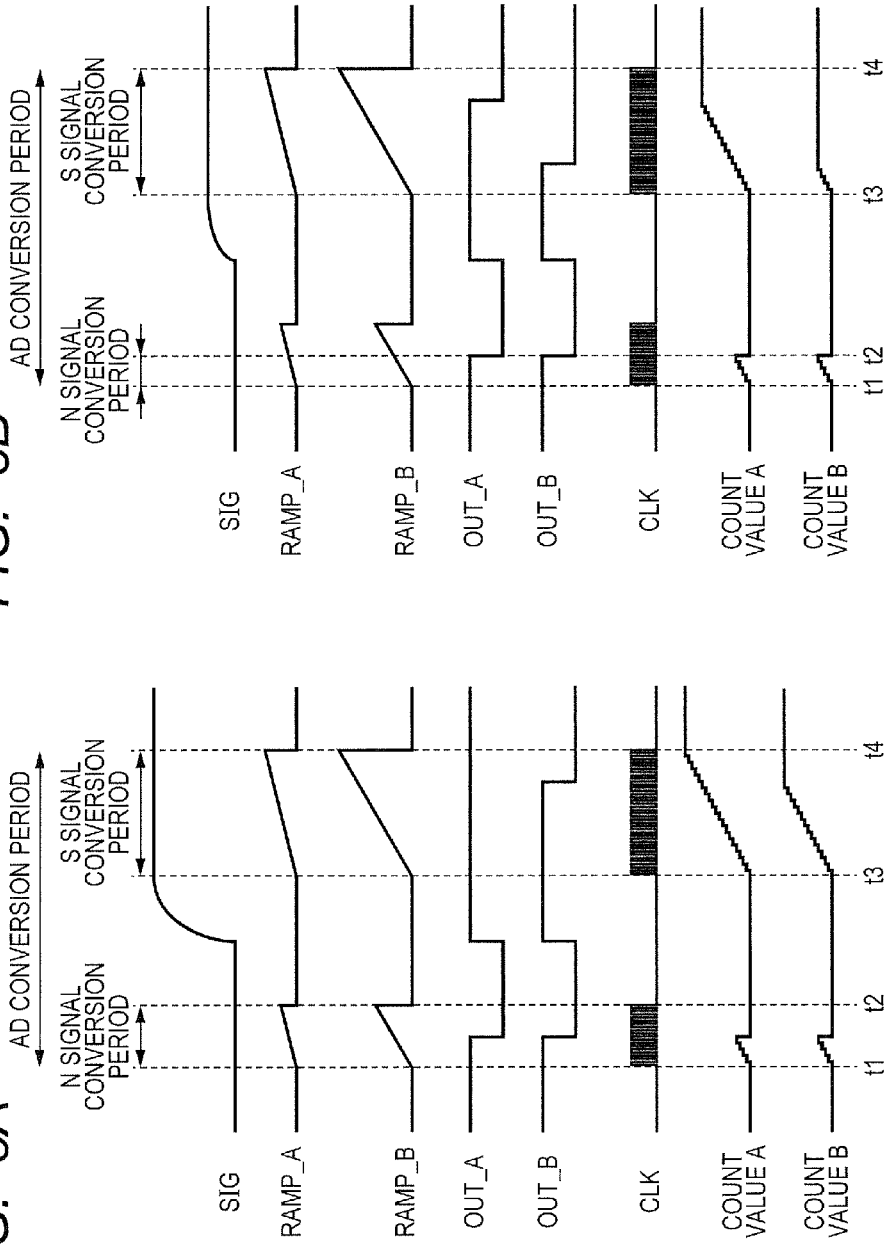
FIGS. 3A and 3B are timing charts for describing AD conversion operations.

The imaging apparatus in the present embodiment switches, by mode switching, modes between a first mode in which the different reference signals RAMP_A and RAMP_B are used and a second mode in which the reference signal RAMP common to all the columns is used. Further, a user may arbitrarily perform the mode switching between a mode of making the gradients of the reference signals different for the respective columns and a mode of making the gradients of the reference signals the same, and alternatively the imaging apparatus may automatically perform the mode switching by detecting the luminance difference in the image. For example, when the luminance difference is large in the image, the imaging apparatus sets, by the mode switching, the first mode of performing the AD conversion to the signals of the adjacent two pixels having the same color by using the reference signals RAMP_A and RAMP_B respectively having the different gradients as illustrated in FIG. 4. This operation will be described hereinafter. FIGS. 3A and 3B are timing charts respectively indicating this case. In FIGS. 3A and 3B, it is assumed that the pixel signals SIG of the adjacent two pixels having the same color are the same, whereby these signals are represented by the one pixel signal SIG. Here, output signals OUT_A and OUT_B are the output signals of the comparator 204 in regard to the respective signals of the adjacent two pixels having the same color. More specifically, the output signal OUT_A is the output signal from the comparator 204 which compared the pixel in the pixel column group 402 with the reference signal RAMP_A having the small gradient, while the output signal OUT_B is the output signal from the comparator 204 which compared the pixel in the pixel column group 403 with the reference signal RAMP_B having the large gradient. As illustrated in FIG. 3A, when the AD conversion is performed to the high-illuminance pixels by using the two reference signals RAMP_A and RAMP_B, the output signal OUT_A of the comparator 204 is not inverted for the pixel to which the reference signal RAMP_A having the small gradient is used. On the other hand, the output signal OUT_B of the comparator 204 is inverted for the pixel to which the reference signal RAMP_B having the large gradient is used. In the later-stage signal processing unit 401, from count values A and B using the reference signals RAMP_A and RAMP_B for the adjacent two pixels having the same color, the count value B which is not saturated is selected, and the selected count value B is set as the representative value of the adjacent two pixels having the same color. In the present embodiment, the selecting method of performing the selection by using only one of the two pixels is used. However, the signal processing method is not limited by the selecting method. That is, it is possible to obtain the pixel signal by performing a synthesizing process or the like of the plurality of pixels. Here, when the three kinds of reference signals are used, the signal process is performed among the three pixels.

FIG. 3B indicates the AD conversion which is performed to the low-illuminance pixel in the one pixel row. In FIG. 3B, since the optical signal level of the pixel signal SIG is small, both the output signal OUT_A of the comparator 204 using the reference signal RAMP_A having the small gradient and the output signal OUT_B of the comparator 204 using the reference signal RAMP_B having the large gradient are inverted. In the later-stage signal processing unit 401, the count value using the small-gradient reference signal RAMP_A of which the resolution for one LSB is larger is selected, and the selected count value is set as the representative value of the adjacent two pixels having the same color. Incidentally, as well as the above, the signal processing method is not limited to the selecting method. Namely, the pixel signal may be obtained by using the count values A and B being the conversion results of both the reference signals RAMP_A and RAMP_B.

In the count value of the conversion result subjected to the AD conversion for each column, the gradient of the reference signal is different. Consequently, the conversion gain viewed from the input signal of the column-parallel AD converting unit 210 is different for each column. That is, the operation of the column-parallel AD converting unit 210 for performing the AD conversion to the pixel signal SIG using the reference signal having the different gradient means to amplify the pixel signal SIG by the different gain. Consequently, to equalize the conversion gains of the pixels in the same row, the later-stage signal processing unit 401 performs the gain correction by dividing the count value of the output result by the gradient ratio of the reference signals. That is, the signal processing unit 401 corrects the difference of the gain corresponding to the difference of the gradient of the reference signal in regard to the count value of the counter 205. Incidentally, the process of selecting or synthesizing the one pixel from the adjacent two pixels having the same color, and the gain correction process may be performed by the signal processing unit 106 provided inside the column-parallel AD converter equipped image sensor 110 or the image processing unit 108 provided outside the column-parallel AD converter equipped image sensor 110. The gradient of the reference signal is controlled based on the mode switching operation by the user, the illuminance detection result of the previous frame or the previous row by the imaging apparatus, or the like.

Here, a first pixel includes, for example, the pixel 202 in the pixel column group 402 of FIG. 4, and the signal is generated from the first pixel by the photoelectric conversion. Further, a second pixel includes, for example, the pixel 202 in the pixel column group 403 of FIG. 4, the second pixel is arranged in the same row as that of the first pixel, and the signal is generated from the second pixel by the photoelectric conversion. The first pixel and the second pixel are the two pixels which are adjacent in the column direction and to which the same-color filters are provided. Incidentally, in the three-CCD color sensor, the monochrome sensor or the like, the first pixel and the second pixel are the two pixels which are adjacent in the column direction.

As illustrated in FIGS. 3A and 3B, the first comparator 204 compares the pixel signal SIG obtained based on the first pixel with the first reference signal RAMP_A of which the level is changed according as time passes, and then outputs the output signal OUT_A. The second comparator 204 compares the pixel signal SIG obtained based on the second pixel with the second reference signal RAMP_B of which the rate of change (gradient) for passage of time is different in regard to the first reference signal RAMP_A, and then outputs the output signal OUT_B.

The first counter 205 counts the count value A until the first comparator 204 outputs the output signal OUT_A indicating that the magnitude relation of the pixel signal SIG obtained based on the first pixel and the first reference signal RAMP_A is inverted. The second counter 205 counts the count value B until the second comparator 204 outputs the output signal OUT_B indicating that the magnitude relation of the pixel signal SIG obtained based on the second pixel and the second reference signal RAMP_B is inverted.

The signal processing unit 401 or the image processing unit 108 generates one pixel signal at least based on the count value A of the first counter 205 and/or the count value B of the second counter 205. Further, as illustrated in FIG. 4, the signal processing unit 401 or the image processing unit 108 corrects a difference of the gains between the count value A of the first counter 205 and the count value B of the second counter 205, corresponding to a difference of the rate of change for passage of time between the first reference signal RAMP_A and the second reference signal RAMP_B.

As illustrated in FIGS. 3A and 3B, in the second reference signal RAMP_B, for example, the rate of change for passage of time is large in regard to the first reference signal RAMP_A. FIG. 3A indicates the case where the magnitude relation (see the output signal OUT_A) of the pixel signal SIG obtained based on the first pixel and the first reference signal RAMP_A is not inverted and the magnitude relation (see the output signal OUT_B) of the pixel signal SIG obtained based on the second pixel and the second reference signal RAMP_B is inverted. In this case, the signal processing unit 401 or the image processing unit 108 generates one pixel signal by selecting the count value B of the second counter 205.

FIG. 3B indicates the case where the magnitude relation (see the output signal OUT_A) of the pixel signal SIG obtained based on the first pixel and the first reference signal RAMP_A is inverted and the magnitude relation (see the output signal OUT_B) of the pixel signal SIG obtained based on the second pixel and the second reference signal RAMP_B is inverted. In this case, the signal processing unit 401 or the image processing unit 108 generates one pixel signal by selecting the count value A of the high-resolution first counter 205. Incidentally, in the case of FIG. 3B, the signal processing unit 401 or the image processing unit 108 may generate one pixel signal by synthesizing the count value A of the first counter 205 and the count value B of the second counter 205.

In the first mode illustrated in FIGS. 3A and 3B, the first comparator 204 compares the pixel signal SIG obtained based on the first pixel with the first reference signal RAMP_A of which the level is changed according as time passes, and then outputs the output signal OUT_A. Further, the second comparator 204 compares the pixel signal SIG obtained based on the second pixel with the second reference signal RAMP_B of which the rate of change for passage of time is different in regard to the first reference signal RAMP_A, and then outputs the output signal OUT_B.

On the other hand, in the second mode illustrated in FIG. 5, the first comparator 204 compares the pixel signal SIG obtained based on the first pixel with the first reference signal RAMP of which the level is changed according as time passes, and then outputs the output signal OUT. Further, the second comparator 204 compares the pixel signal SIG obtained based on the second pixel with the second reference signal RAMP of which the rate of change for passage of time is the same in regard to the first reference signal RAMP, and then outputs the output signal OUT.

(Second Embodiment)

Figure 8:
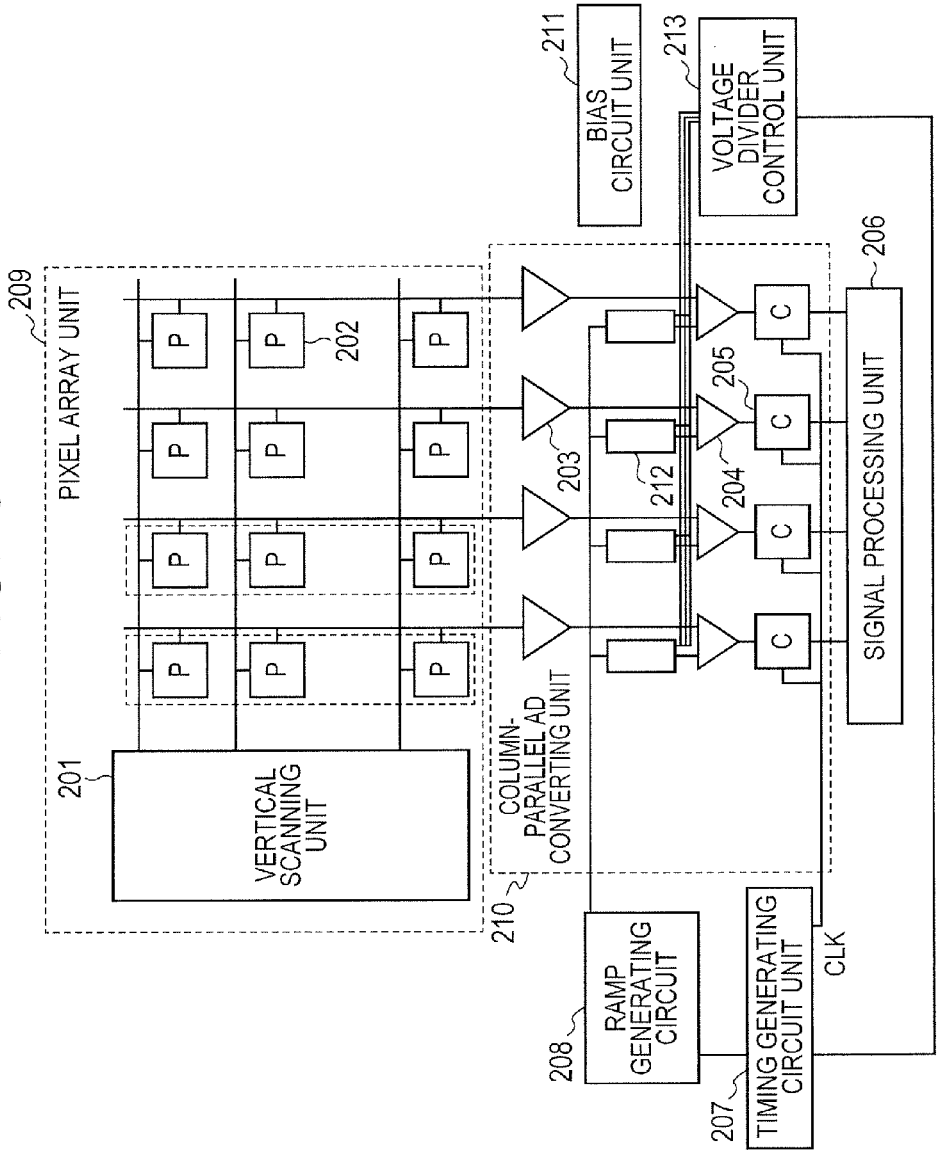
FIG. 8 is a block diagram illustrating a column-parallel AD converter equipped image sensor.

FIG. 8 is a block diagram illustrating a constitution example of an imaging apparatus according to the second embodiment of the present invention. Although the plurality of ramp generating circuits 208 are used to generate the several kinds of reference signals in the first embodiment, voltage dividers 212 are used as another means for generating several kinds of reference signals in the second embodiment of the present invention. In the present embodiment (FIG. 8), the voltage dividers 212 are added to the constitution as described in the first embodiment (FIG. 2). In the present embodiment, the point which is different from the first embodiment will be described hereinafter.

In the present embodiment, since the voltage divider 212 is provided for each column, it is possible by a single ramp generating circuit 208 to generate a plurality of different reference signals. The ramp generating circuit 208 generates the reference signal which is common to each column, and outputs the generated reference signal to the voltage divider 212 of each column. Then, the common reference signal generated by the ramp generating circuit 208 is input to the voltage divider 212 of each column. Thus, the ramp generating circuit 208 can generate the plurality of reference signals having different gradients according to a gradient control signal transferred from a voltage divider control unit 213. Here, the voltage divider 212 can change the gradient of the reference signal by, for example, a resistance division method. A comparator 204 compares the reference signal generated by the voltage divider 212 with an output signal SIG of a column amplifier 203. Here, it should be noted that the pixel selection method and the gain correction method of the signal processing unit 401 are the same as those in the first embodiment. As described above, according to the present embodiment, even if the plurality of ramp generating circuits 208 are not provided, it is possible to have the effect equivalent to that in the first embodiment.

(Third Embodiment)

FIG. 9 is a block diagram illustrating a constitution example of an imaging apparatus according to the third embodiment of the present invention. The present embodiment (FIG. 9) is different from the first embodiment (FIG. 4) in the point that pixel columns 901 and 902 are provided. In the present embodiment, the point different from the first embodiment will be described hereinafter. In the first embodiment, the color filters in which the four pixels of R, Gr, Gb and B are arranged so as to be adjacent are used. Here, there is a case where it becomes necessary to change the pixel to be selected by a signal processing unit 401 from that to be selected in the first embodiment, depending on the arrangement of the color filters. As such an example, a case where the color filters in which R, R, Gr, Gr, Gb, Gb, B and B are arranged is used will be described as the third embodiment of the present invention. Hereinafter, the point of the present embodiment different from that of the first embodiment will be described.

The plurality of pixels 202 are divided into the pixel column group 901 and the pixel column group 902, and the color filter is provided on each of the pixels 202. Here, the pixel column group 901 is the pixel region of the columns corresponding to the pixel signal to be subjected to the AD conversion by using the reference signal RAMP_A. On the other hand, the pixel column group 902 is the pixel region of the columns corresponding to the pixel signal to be subjected to the AD conversion by using the reference signal RAMP_B. As illustrated in FIG. 9, in the case where the color filters in which R, R, Gr, Gr, Gb, Gb, B and B are arranged for the eight pixels are used, the reference signals having the different gradients are used between the same-color pixel columns which are most adjacent in one row. In a column-parallel AD converter equipped image sensor 110 in which the color filters like this are used, for example, when two kinds of reference signals are used, the reference signals RAMP_A and RAMP_B are alternately used in the AD conversion for one pixel column. That is, the reference signals RAMP_A and RAMP_B respectively having the different gradients are used respectively for the pixel columns 901 and 902. In the first embodiment, as illustrated in FIG. 4, when the signal processing unit 401 performs the selecting/synthesizing process to the AD conversion result of the column-parallel AD converting unit 404, it is necessary to cross the selection portions of the pixels. On the other hand, in the present embodiment, as illustrated in FIG. 9, since the adjacent pixels have the same color, the signal processing unit 401 only has to perform the selecting/synthesizing process between the adjacent pixels without changing the AD conversion result of the column-parallel AD converting unit 404. Incidentally, it should be noted that the present embodiment is also applicable to the second embodiment.

As described above, since the signal processing unit 401 selects or synthesizes the AD conversion results between the same-color pixel signals, it is possible to extend the dynamic range even in the case where the color filter arrangements are different.

Incidentally, all of the above-described embodiments merely show the examples of concretization in the case where the present invention is carried out. That is, the technical scope of the present invention must not be interpreted in a limited way. In other words, the present invention can be carried out in a variety of ways without departing from its technical idea or its main feature.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-158232, filed Jul. 19, 2011, which is hereby incorporated by reference herein in its entirety.

What is claimed is:

1. An imaging apparatus comprising:
   a first pixel configured to generate a signal by photoelectric conversion;
   a second pixel, arranged in a row same as that in which the first pixel is arranged, configured to generate a signal by photoelectric conversion, wherein color filters respectively having a same color are provided on the first pixel and the second pixel;
   a first comparator configured to compare the signal based on the first pixel with a first reference signal of which a level is changed according to passage of time;
   a second comparator configured to compare the signal based on the second pixel with a second reference signal of which a rate of change for passage of time is different from that of the first reference signal;
   a first counter configured to perform counting until the first comparator outputs a signal indicating that a magnitude relation of the signal based on the first pixel and the first reference signal is inverted;
   a second counter configured to perform counting until the second comparator outputs a signal indicating that a magnitude relation of the signal based on the second pixel and the second reference signal is inverted; and
   a processing unit configured to generate one pixel signal based on a count value of the first counter and a count value of the second counter.

2. The imaging apparatus according to claim 1, wherein the first pixel and the second pixel are adjacent in a column direction.

3. The imaging apparatus according to claim 1, wherein the processing unit corrects a difference between gains of the count values of the first counter and the second counter, corresponding to a difference between the rates of change of the first reference signal and the second reference signal for passage of time.

4. The imaging apparatus according to claim 1, wherein
   the rate of change of the second reference signal for passage of time is larger than the rate of change of the first reference signal for passage of time, and
   in a case where the magnitude relation of the signal based on the first pixel and the first reference signal is not inverted and the magnitude relation of the signal based on the second pixel and the second reference signal is inverted, the processing unit generates one pixel signal by selecting the count value of the second counter.

5. The imaging apparatus according to claim 1, wherein
the rate of change of the second reference signal for passage of time is larger than the rate of change of the first reference signal for passage of time, and
in a case where the magnitude relation of the signal based on the first pixel and the first reference signal is inverted and the magnitude relation of the signal based on the second pixel and the second reference signal is inverted, the processing unit generates one pixel signal by selecting the count value of the first counter.

6. The imaging apparatus according to claim 1, wherein, in the case where the magnitude relation of the signal based on the first pixel and the first reference signal is inverted and magnitude relation of the signal based on the second pixel and the second reference signal is inverted, the processing unit generates one pixel signal by synthesizing the count value of the first counter and the count value of the second counter.

7. The imaging apparatus according to claim 1, wherein the second comparator compares the signal based on the second pixel with the second reference signal of which the rate of change for passage of time is different from that of the first reference signal in a first mode, and compares the signal based on the second pixel with the second reference signal of which the rate of change for passage of time is the same as that of the first reference signal in a second mode.

8. An imaging apparatus comprising:
a first pixel configured to generate a signal by photoelectric conversion;
a second pixel, arranged in a row same as that in which the first pixel is arranged, configured to generate a signal by photoelectric conversion, wherein color filters respectively having a same color are provided on the first pixel and the second pixel;
a first comparator configured to compare the signal based on the first pixel with a first reference signal of which a level is changed according to passage of time;
a second comparator configured to compare the signal based on the second pixel with a second reference signal of which a rate of change for passage of time is different from that of the first reference signal;
a first counter configured to perform counting until the first comparator outputs a signal indicating that a magnitude relation of the signal based on the first pixel and the first reference signal is inverted;
a second counter configured to perform counting until the second comparator outputs a signal indicating that a magnitude relation of the signal based on the second pixel and the second reference signal is inverted; and
a processing unit configured to generate one pixel signal by selecting one of a count value of the first counter and a count value of the second counter or by synthesizing the count value of the first counter and the count value of the second counter.

\* \* \* \* \*